US009817938B2

(12) United States Patent
Jeevan et al.

(10) Patent No.: US 9,817,938 B2
(45) Date of Patent: Nov. 14, 2017

(54) APPARATUS AND METHOD FOR PROVIDING ARRANGEMENT PATTERN

(71) Applicant: Hanwha Techwin Co., Ltd., Changwon-si (KR)

(72) Inventors: Rathod Jeevan, Changwon-si (KR); Korukonda Parthasarathy, Changwon-si (KR); Kyung Dong Park, Changwon-si (KR)

(73) Assignee: Hanwha Techwin Co., Ltd., Changwon-si (KR)

( * ) Notice: Subject to any disclaimer, the term of this patent is extended or adjusted under 35 U.S.C. 154(b) by 0 days.

(21) Appl. No.: 15/067,326

(22) Filed: Mar. 11, 2016

(65) Prior Publication Data

US 2017/0147731 A1 May 25, 2017

(30) Foreign Application Priority Data

Nov. 19, 2015 (KR) ........................ 10-2015-0162221

(51) Int. Cl.
*G06F 17/50* (2006.01)
(52) U.S. Cl.
CPC ................................ *G06F 17/5072* (2013.01)
(58) Field of Classification Search
CPC .................................................. G06F 17/5072
USPC ........................................................ 716/137
See application file for complete search history.

(56) References Cited

U.S. PATENT DOCUMENTS

| 2006/0053341 | A1* | 3/2006 | Haarberg | G05B 19/41805 714/34 |
| 2008/0062049 | A1* | 3/2008 | Soler Castany | H01Q 1/38 343/702 |
| 2008/0222876 | A1* | 9/2008 | Weber | H05K 1/183 29/592.1 |
| 2013/0301266 | A1 | 11/2013 | Poissonnet et al. | |
| 2014/0159079 | A1 | 6/2014 | Wang | |

FOREIGN PATENT DOCUMENTS

KR 10-2011-0055210 A 5/2011

* cited by examiner

*Primary Examiner* — Suchin Parihar
(74) *Attorney, Agent, or Firm* — Sughrue Mion, PLLC

(57) ABSTRACT

An apparatus for providing an arrangement pattern includes an input unit configured to receive an input of group information of groups, the groups comprising a plurality of components having the same function and being classified based on a predetermined standard; an arrangement pattern calculation unit configured to determine an arrangement pattern for arranging the plurality of components on a printed circuit board (PCB) so that first components of a first group of the groups are dispersedly arranged amongst the plurality of components based on the group information of the groups; and an output unit configured to output the determined arrangement pattern.

20 Claims, 10 Drawing Sheets

FIG. 7

| A(2.5) | | B(5) | | C(10) | |
|---|---|---|---|---|---|
| INTERVAL INDEX | ARRANGEMENT INDEX | INTERVAL INDEX | ARRANGEMENT INDEX | INTERVAL INDEX | ARRANGEMENT INDEX |
| 0 | 0 | 0 | 0 | 0 | 0 |
| 2.5 | 3 | 5 | 5 | 10 | 10 |
| 5 | 5 | 10 | 10 | 20 | 20 |
| 7.5 | 8 | 15 | 15 | 30 | 30 |
| 10 | 10 | 20 | 20 | 40 | 40 |
| 12.5 | 13 | 25 | 25 | 50 | 50 |
| 15 | 15 | 30 | 30 | 60 | 60 |
| 17.5 | 18 | 35 | 35 | 70 | 70 |
| 20 | 20 | 40 | 40 | 80 | 80 |

⋮

APPARATUS AND METHOD FOR PROVIDING ARRANGEMENT PATTERN

CROSS-REFERENCE TO RELATED APPLICATION

This application claims priority from Korean Patent Application No. 10-2015-0162221, filed on Nov. 19, 2015 in the Korean Intellectual Property Office, the disclosure of which is incorporated herein by reference in its entirety.

BACKGROUND

1. Field

Apparatuses and methods consistent with exemplary embodiments relate to providing an arrangement pattern for components on a substrate, and more particularly to providing an arrangement pattern for components on a substrate, which make it possible to mitigate and recognize a difference in performance between display components manufactured by different manufacturers through disperse arrangement of the display components having similar functions.

2. Description of the Prior Art

There may exist a difference in performance between even the same components manufactured by different manufacturers. For example, there may be difference in color and brightness between display components, such as LEDs (Light Emitting Diodes), in accordance with respective manufacturers.

In the case of arranging LEDs having similar functions adjacent to one another on a printed circuit board, the LEDs may have colors and brightness that are grouped by performances (e.g., by different manufacturers). For example, specific areas may be too bright, while other areas may be too dark.

Accordingly, there is a need for schemes to make it possible to mitigate and recognize the difference in performance between the display components.

SUMMARY

One or more exemplary embodiments provide an apparatus and a method for providing an arrangement pattern, which make it possible to mitigate and recognize a difference in performance between display components by manufacturers through disperse arrangement of the display components having similar functions.

Additional advantages, subjects, and features of the disclosure will be set forth in part in the description which follows and in part will become apparent to those having ordinary skill in the art upon examination of the following or may be learned from practice of the exemplary embodiments.

According to an aspect of an exemplary embodiment, there is provided an apparatus for providing an arrangement pattern, which includes an input unit configured to receive an input of group information of groups in which a plurality of components that provide the same functions are classified in accordance with a predetermined standard; an arrangement pattern calculation unit configured to calculate an arrangement pattern for arranging the plurality of components on one printed circuit board so that the components that are included in the same group among the plurality of components are dispersedly arranged with reference to the group information; and an output unit configured to output the calculated arrangement pattern.

According to an aspect of another exemplary embodiment, there is provided a method for providing an arrangement pattern, which includes receiving an input of group information of groups in which a plurality of components that provide the same functions are classified in accordance with a predetermined standard; calculating an arrangement pattern for arranging the plurality of components on one printed circuit board so that the components that are included in the same group among the plurality of components are dispersedly arranged with reference to the group information; and outputting the calculated arrangement pattern.

According to an aspect of another exemplary embodiment, there is provided an apparatus for providing an arrangement pattern, including: an input unit configured to receive an input of group information about groups, the groups including a plurality of components having a same function and being classified based on a predetermined standard; an arrangement pattern calculation unit configured to determine an arrangement pattern for arranging the plurality of components on a substrate so that first components of a first group of the groups are dispersedly arranged amongst the plurality of components based on the group information of the groups; and an output unit configured to output the determined arrangement pattern.

The group information may include at least one of a lot number, an identification number, performance, and a number of components included in a corresponding group in the groups.

Each group may include a reel including at least one component.

The arrangement pattern calculation unit may be configured to calculate the arrangement pattern through a random-based algorithm in response to the number of first components included in the first group being greater than or equal to a threshold value.

The arrangement pattern calculation unit may be configured to set a masking area having a predetermined size on the substrate so that a plurality of divided areas are included in the masking area, configured to determine remaining groups out of the groups, the remaining groups excluding a group having components included in the masking area, and configured to determine the arrangement pattern so that components of the remaining groups are arranged at the plurality of divided areas.

In response to there not being the remaining groups included in the masking area, the arrangement pattern calculation unit may be configured to determine the arrangement pattern so that components of a randomly selected group among the groups are arranged at the plurality of divided areas in the masking area.

The arrangement pattern calculation unit may be configured to determine the arrangement pattern through a rate-based algorithm in response to the number of first components included in the first group being smaller than a threshold value.

The arrangement pattern calculation unit may be configured to determine the arrangement pattern so that the first components of the first group are arranged at an interval corresponding to the number of components included in the first group.

The interval corresponding to the number of first components included in the first group may be determined by a ratio of a total number of components arranged on the substrate to the number of first components included in the first group.

The output unit may be configured to output the arrangement pattern in which the plurality of components are displayed with different colors based on the groups.

The arrangement pattern calculation unit may be configured to determine the arrangement pattern so that components of respective groups are repeatedly arranged in a predetermined order of groups.

The arrangement pattern calculation unit may be configured to determine the arrangement pattern so that components included two or more predetermined groups of the groups are dispersedly arranged.

According to an aspect of another exemplary embodiment, there is provided a method for providing an arrangement pattern, including: receiving an input of group information about groups, the groups including a plurality of components having a same functions and being classified based on a predetermined standard; determining an arrangement pattern for arranging the plurality of components on a substrate so that first components of a first group of the groups are dispersedly arranged amongst the plurality of components based on the group information of the groups; and outputting the determined arrangement pattern.

The group information may include at least one of a lot number, an identification number, performance, and a number of components included in a corresponding group in the groups.

The determining the arrangement pattern may include determining the arrangement pattern through a random-based algorithm in response to the number of first components included in the first group being greater than or equal to a threshold value.

The determining the arrangement pattern may include: setting a masking area having a predetermined size on the substrate so that a plurality of divided areas are included in the masking area, the plurality of components being arranged at the plurality of divided areas; selecting remaining groups out of the groups, the remaining groups excluding a group having components included in the masking area; and determining the arrangement pattern so that components of the remaining groups are arranged at the plurality of areas.

The determining the arrangement pattern may include determining the arrangement pattern through a rate-based algorithm in response to the number of first components included in the first group is smaller than a threshold value.

The determining the arrangement pattern may include determining the arrangement pattern so that the first components of the first group are arranged at an interval corresponding to the number of first components included in the first group.

The interval corresponding to the number of first components included in the first group may be determined by a ratio of a total number of the plurality of components arranged on the substrate to the number of first components included in the first group.

The outputting the arrangement pattern may include outputting the arrangement pattern in which the plurality of components are displayed with different colors based on the groups.

BRIEF DESCRIPTION OF THE DRAWINGS

The above and/or other objects, features and advantages of the disclosure will be more apparent from the following detailed description taken in conjunction with the accompanying drawings, in which:

FIG. 7 is a diagram explaining a gap table for groups according to an exemplary embodiment;

DETAILED DESCRIPTION OF THE EMBODIMENTS

Figure 1:
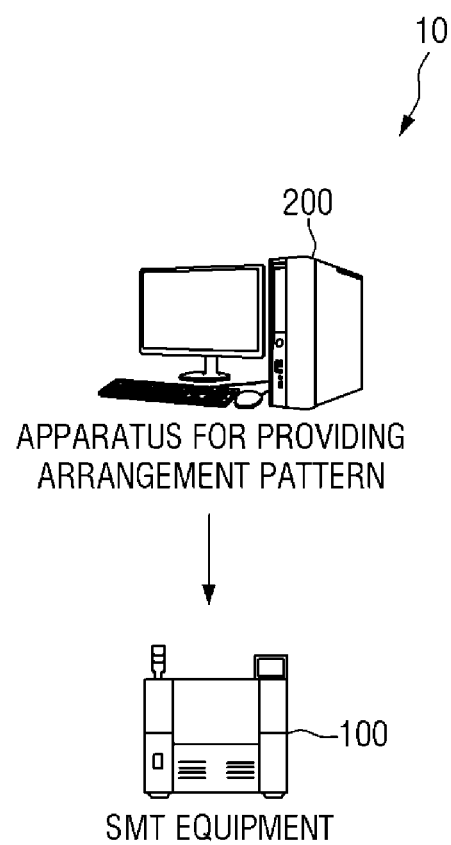
FIG. 1 is a diagram illustrating a component arrangement system according to an exemplary embodiment.

Hereinafter, exemplary embodiments will be described in detail with reference to the accompanying drawings. The aspects and features of the inventive concept and methods for achieving the aspects and features will be apparent by referring to the embodiments to be described in detail with reference to the accompanying drawings. However, the disclosure is not limited to the exemplary embodiments disclosed hereinafter, but can be implemented in diverse forms. In the entire description of the exemplary embodiments, the same drawing reference numerals are used for the same elements across various figures.

Unless specially defined, all terms (including technical and scientific terms) used in the description could be used as meanings commonly understood by those ordinary skilled in the art to which the inventive concept belongs. In addition, terms that are generally used but are not defined in the dictionary are not interpreted ideally or excessively unless they have been clearly and specially defined.

FIG. 1 is a diagram illustrating a component arrangement system according to an exemplary embodiment.

Referring to FIG. 1, a component arrangement system 10 includes SMT surface mounting technology (SMT) equipment 100 and an apparatus 200 for providing an arrangement pattern.

The apparatus 200 for providing an arrangement pattern serves to generate an arrangement pattern of components used in the SMT equipment 100 of an SMT line. The arrangement pattern of components may be provided in the form of a work file.

The SMT process includes a process of mounting various kinds of Surface Mounting Devices (SMDs) on a printed circuit board (PCB) using mounting equipment. In the exemplary embodiment, it may be understood that a work file includes mount sequence data, such as computer-aided design (CAD) data or bill of material (BOM) data, which is required to mount the SMDs.

For example, the work file may include work data, such as component reference, X value, Y value, Z value, R value, component name, feeder, nozzle, header number, skip information, and priority level.

In the SMT line, a user may generate work data through an off-line program (OLP). The OLP that is an operation solution program indicates assignee's CAD-based integrated programming software for SMT line operation.

In generating a work file by the apparatus 200 for providing an arrangement pattern, an OLP may be used, but the present invention is not limited thereto.

The SMT equipment 100 may mount components on the PCB. The SMT equipment 100 may perform a SMT processing work using a work file that is received from the apparatus 200 for providing an arrangement pattern.

In the exemplary embodiment, the SMT equipment 100 may mount display components, such as Light Emitting Diodes (LEDs), on the PCB. For example, the SMT equipment 100 may mount a plurality of LEDs on a PCB at predetermined intervals.

On the other hand, there may exist a difference in performance between different LEDs. For example, the LEDs may differ from one another in color and brightness. Such a difference in performance may exist by manufacturers. Further, even LEDs that are manufactured by the same manufacturer may exhibit difference in performance by manufacturing lines or by manufacture year.

In particular, LEDs are supplied to the SMT equipment 100 by means of reels, and there may exist a substantial difference in performance by reels. That is, an LED that is included in a specific reel and an LED that is included in another reel may differ from each other in performance. Accordingly, in the case where a plurality of LEDs are grouped by reels and are arranged on a PCB, respective areas of the PCB may differ from one another in color or brightness.

Figure 2:
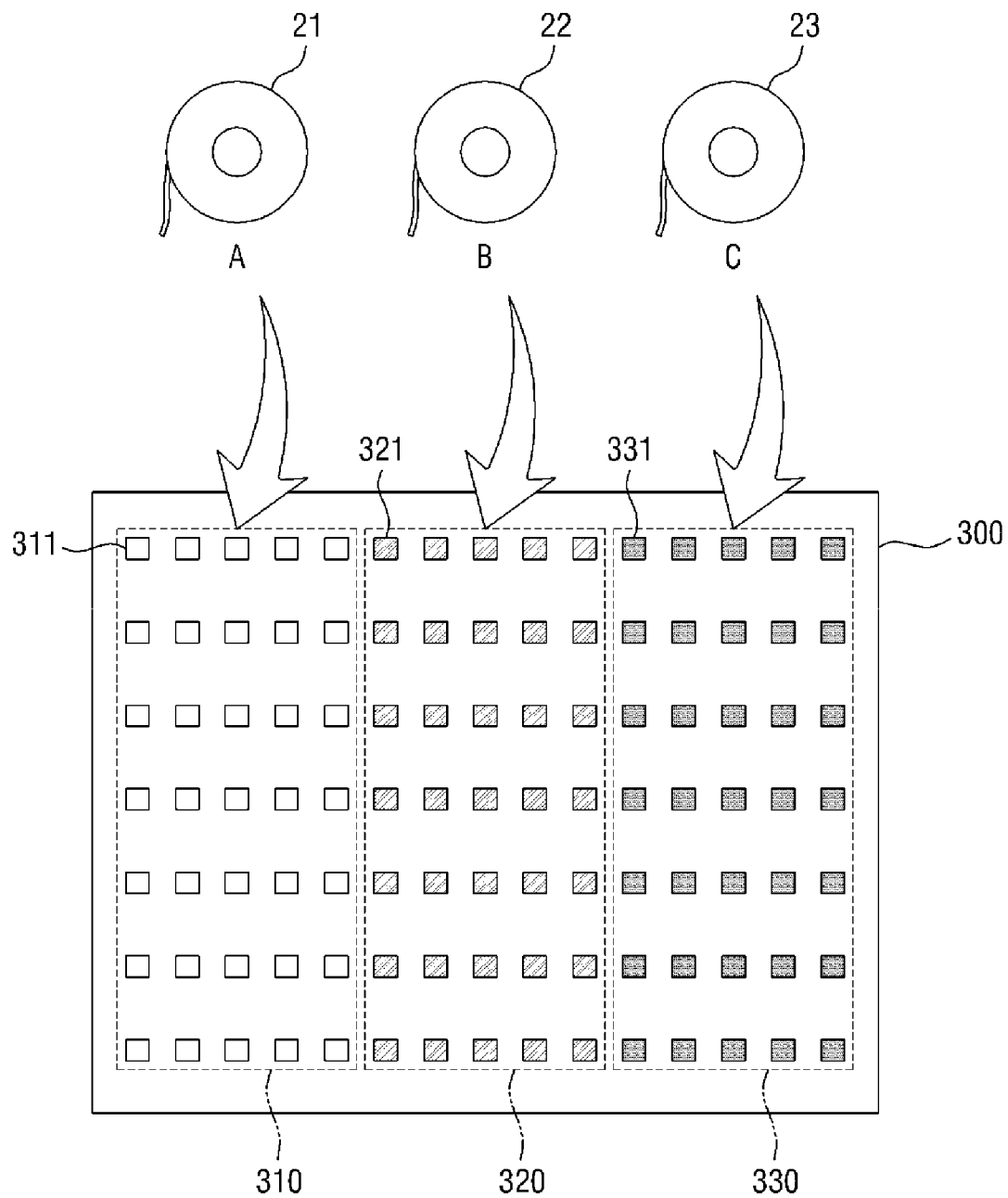
FIG. 2 is a diagram illustrating components of the same group that are concentratedly arranged.

FIG. 2 is a diagram illustrating components of the same group that are concentratedly arranged.

Referring to FIG. 2, on a PCB 300, components 311, 321, and 331 that are supplied from a plurality of reels 21, 22, and 23 may be mounted. The component 311 that is supplied from the reel A 21 may form one component area 310, the component 321 that is supplied from the reel B 22 may form one component area 320, and the component 331 that is supplied from the reel C 23 may form one component area 330.

On the other hand, in the case where the components 311, 321, and 331 that are supplied from the respective reels 21, 22, and 23 are concentratedly mounted on a specific area of the PCB 300, display imbalance may occur. For example, the LED of the reel B 22 may emit brighter light in comparison to the LED of the reel A 21, and the LED of the reel C 23 may emit brighter light in comparison to the LED of the reel B 22. In this case, the PCB 300 of FIG. 2 may include the area 310 having low brightness, the area 320 having intermediate brightness, and the area 330 having high brightness. Further, the brightness of the PCB 300 may be increased from left to right.

In order to prevent the display imbalance of the LEDs as described above, the apparatus 200 for providing an arrangement pattern according to an exemplary embodiment may generate an arrangement pattern so that the LEDs included in the same reel are not concentratedly arranged. A work file is created through reflection of the generated arrangement pattern, and the SMT equipment 100 may mount the LEDs on the PCB in accordance with the arrangement pattern that is specified in the work file.

Hereinafter, the apparatus 200 for providing an arrangement pattern will be described in detail.

Figure 3:
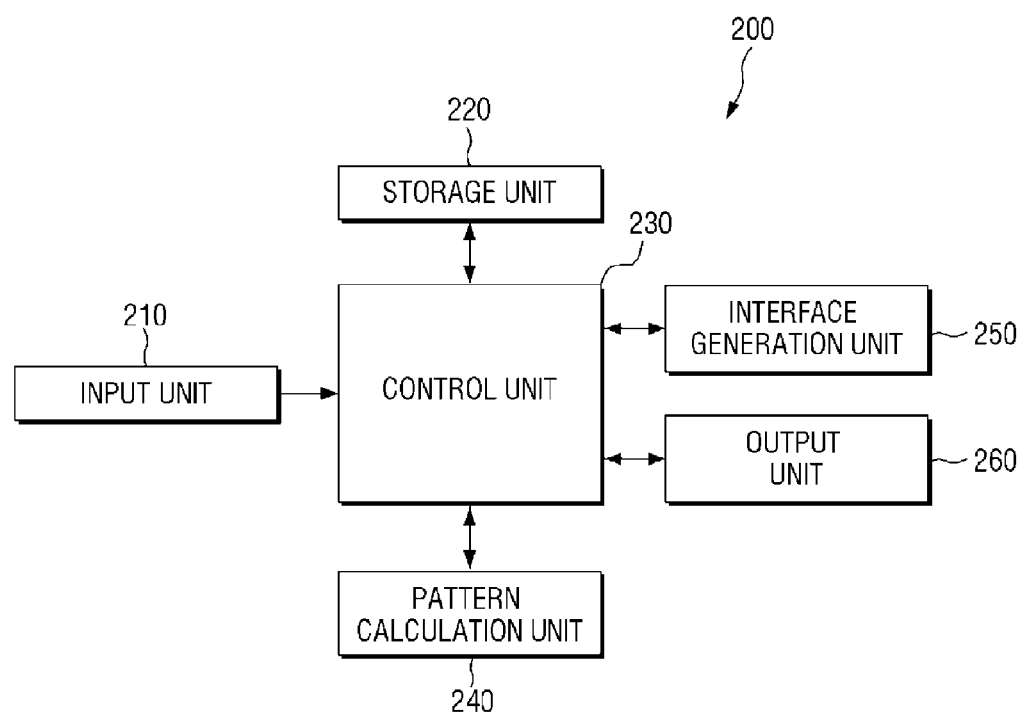
FIG. 3 is a block diagram illustrating the configuration of an apparatus for providing an arrangement pattern according to an exemplary embodiment.

FIG. 3 is a block diagram illustrating a configuration of an apparatus 200 for providing an arrangement pattern according to an exemplary embodiment.

Referring to FIG. 3, the apparatus 200 for providing an arrangement pattern includes an input unit 210, a storage unit 220, a control unit 230, an arrangement pattern calculation unit 240, an interface generation unit 250, and an output unit 260.

The input unit 210 serves to receive an input of a user command. The input unit 210 may be implemented in the form of a button, wheel, or jog shuttle to receive a user command. The input unit 210 may receive the user command in a wired or wireless communication method.

Specifically, the input unit 210 may receive an input of group information of groups in which a plurality of components that provide the same functions are classified in accordance with a predetermined standard. Here, the plurality of components that provide the same function may include display components such as LEDs. However, the information on the components that is input through the input unit 210 is not limited to the information on the LEDs. Hereinafter, explanation will be mode on the assumption that the information on the LEDs is input by the input unit 210.

The group information that is input by the input unit 210 includes at least one of a lot number, an identification number, performance, and a number of components included in the corresponding group. In the exemplary embodiment, the components may be grouped to a plurality of groups, and the input unit 210 may receive an input of at least one of the lot number, the performance, and the number of the components as information for specifying the group.

As described above, the components, such as LEDs, may be provided in the form of reels. In the exemplary embodiment, it may be understood that the component group means a reel that includes at least one component. For example, the input unit 210 may receive an input of the lot number of the reel, the identification number of the reel, the performance of components included in the reel, and the number of components included in the reel. If the component included in the reel is an LED, the performance thereof may include, for example, a color and brightness thereof.

The arrangement pattern calculation unit 240 may serve to calculate an arrangement pattern for arranging a plurality of components on one PCB. That is, the arrangement pattern calculation unit 240 may calculate the arrangement pattern for dispersedly arranging the components that are included in the same group among the plurality of components with reference to the group information that is input through the input unit 210.

According to an exemplary embodiment, an algorithm for dispersedly arranging the components included in the same group may include a random-based algorithm and a rate-based algorithm. The random-based algorithm is an algorithm for arranging the components of the groups randomly selected among the plurality of groups in arranging the components at specific points of the PCB.

If a sufficiently large number of components are provided in the provided groups, the components of any group can be mounted at the specific points of the PCB. Accordingly, if the number of components included in the respective groups is greater than or equal to a threshold value, the arrangement pattern calculation unit 240 may calculate the arrangement pattern through the random-based algorithm.

On the other hand, if there exists the group that includes an insufficient number of components among the groups, it is required to consider the number of components included in the corresponding group in calculating the arrangement pattern. For example, it is assumed that the number of components that should be mounted on the PCB is one hundred (100) and the number of components included in group A is 5. In the case of calculating the arrangement pattern through the random-based algorithm, according to circumstances, the components of the group A may be concentrated onto a predetermined area. The components included in the group A may be too bright or dim, and in this case, display imbalance may occur.

Accordingly, if there exist the components of which the number is smaller than the threshold value among the components included in the respective groups, the arrangement pattern calculation unit 240 may calculate the arrangement pattern through the rate-based algorithm.

The rate-based algorithm is an algorithm for arranging the components in consideration of the number of components that should be mounted on the PCB and the number of components included in the respective groups. According to the rate-based algorithm, as the number of components included in the group becomes greater, the arrangement interval may become smaller, while as the number of components included in the group becomes smaller, the arrangement interval may become larger.

By adjusting the arrangement interval in accordance with the number of components included in the respective groups, it becomes possible to prevent the display imbalance with respect to different performance criteria (e.g., color and/or brightness) that is caused by the concentrated arrangement of the components of a specific group.

In addition to the random-based algorithm and the rate-based algorithm, the arrangement pattern calculation unit 240 may calculate the arrangement pattern so that the components are repeatedly arranged in the predetermined order of groups. Here, the predetermined order of groups may be set by a user, and the user may input the order of the groups using the input unit 210. For example, the user may input the identification numbers of the groups in the order of B, C, A, F, E, and D.

Accordingly, the arrangement pattern calculation unit 240 may calculate the arrangement pattern so that the components are repeatedly arranged in the order of B, C, A, F, E, and D.

Further, the user may input different group orders. For example, the user may input A, F, D, B, and C as the first group order, may input F, C, E, D, A, and B as the second group order, and may input D, E, and C as the third group order.

Accordingly, the arrangement pattern calculation unit 240 may calculate the arrangement pattern for the whole PCB by randomly selecting one of the three group orders and repeating arrangement pattern calculation in accordance with the selected group order. For example, if the second group order is selected at the first stage, the arrangement pattern may be calculated so that the components are arranged in the order of F, C, E, D, A, and B, and then if the first group order is selected, the arrangement pattern may be calculated so that the components are arranged in the order of A, F, D, B, and C.

The group order selection and the component arrangement as described above may be performed until the arrangement pattern for the entire PCB is calculated.

Further, the arrangement pattern calculation unit 240 may calculate the arrangement pattern so that the components included two or more predetermined groups are dispersedly arranged. For example, group A and group B are different from each other, but the performances of the components group A and group B may be similar to each other. In this case, the user may input that group A and group B are groups having similar functions.

Accordingly, in calculating the arrangement pattern through the random-based algorithm or the rate-based algorithm, the arrangement pattern calculation unit 240 may calculate the arrangement pattern so that the groups of the components having similar functions are not adjacently arranged.

The storage unit 220 may temporarily or permanently store a user command input through the input unit 210. Further, the storage unit 220 may store the arrangement pattern that is calculated by the arrangement pattern calculation unit 240 and a work file in which the corresponding arrangement pattern is reflected. Further, the storage unit 220 may temporarily or permanently store various kinds of information required to calculate the arrangement pattern.

The interface generation unit 250 serves to generate an interface in which the arrangement pattern that is calculated by the arrangement pattern calculation unit 240 is provided. The generated interface may be output through the output unit 260. The user may confirm in advance the arrangement pattern of the components arranged in the areas of the PCB through the interface that is output through the output unit 260. The output unit 260 may output the arrangement pattern in which the components are displayed with different colors by groups. Because the respective components are displayed with different colors by groups, the user can conveniently confirm the components of the respective groups.

The control unit 230 serves to generally control the input unit 210, the storage unit 220, the arrangement pattern calculation unit 240, the interface generation unit 250, and the output unit 260.

Further, the control unit 230 may generate a work file with reference to the arrangement pattern that is generated by the arrangement pattern calculation unit 240. The work file that is generated by the control unit 230 may be transferred to the SMT equipment 100, and the SMT equipment 100 may mount the components on the PCB using the transferred work file.

The work file may be transferred by the user. For example, the user may transfer the work file from the apparatus 200 for providing an arrangement pattern to the SMT equipment 100, for example, using a portable storage device (not illustrated).

On the other hand, the work file may be directly transferred from the apparatus 200 for providing an arrangement pattern to the SMT equipment 100. For this, a wired or wireless communication channel may be formed between the apparatus 200 for providing an arrangement pattern and the SMT equipment 100.

Although it is described that the apparatus 200 for providing an arrangement pattern and the SMT equipment 100 are separate devices, the exemplary embodiment is not limited thereto. For example, the apparatus 200 for providing an arrangement pattern and the SMT equipment 100 may be combined to be provided as a single device.

Figure 4:
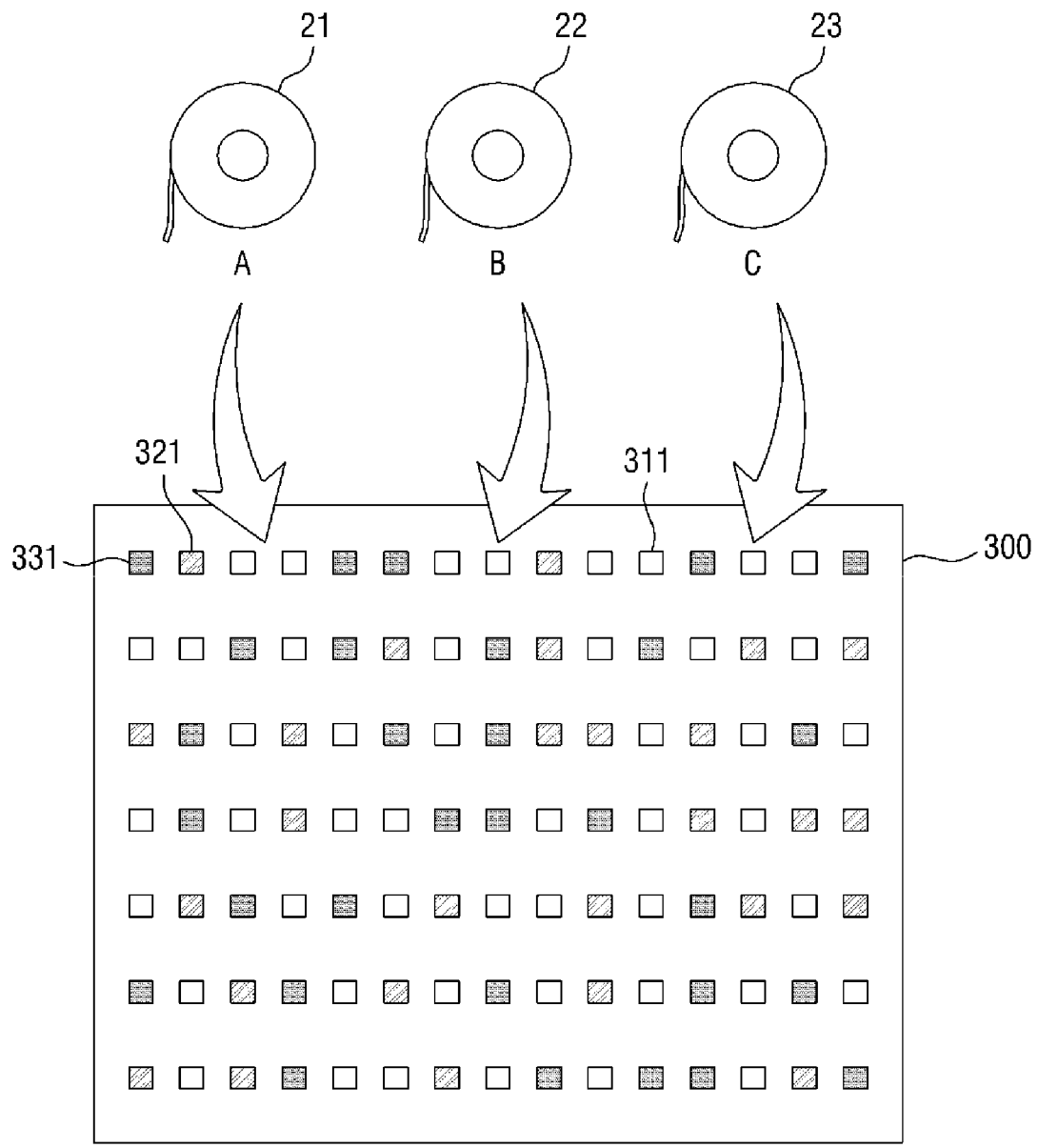
FIG. 4 is a diagram illustrating components of the same group that are dispersed and arranged in accordance with an arrangement pattern according to an exemplary embodiment.

FIG. 4 is a diagram illustrating components of the same group that are dispersed and arranged in accordance with an arrangement pattern according to an embodiment.

Referring to FIG. 4, on a PCB 300, components 311, 321, and 331 that are supplied from a plurality of reels 21, 22, and 23 may be mounted. The components 311, 321, and 331 that are supplied from the reel A 21, the reel B 22, and the reel C 23 may be uniformly arranged on the entire areas of the PCB 300.

As described above, because the components 311, 321, and 331 that are supplied from the respective reels 21, 22, and 23 are uniformly arranged on the entire areas of the PCB 300, the display imbalance can be prevented. The components 311, 321, and 331 that are supplied from the respective reels 21, 22, and 23 may operate with different performances, but may be recognized as uniform performance of the whole PCB 300.

Figure 5:
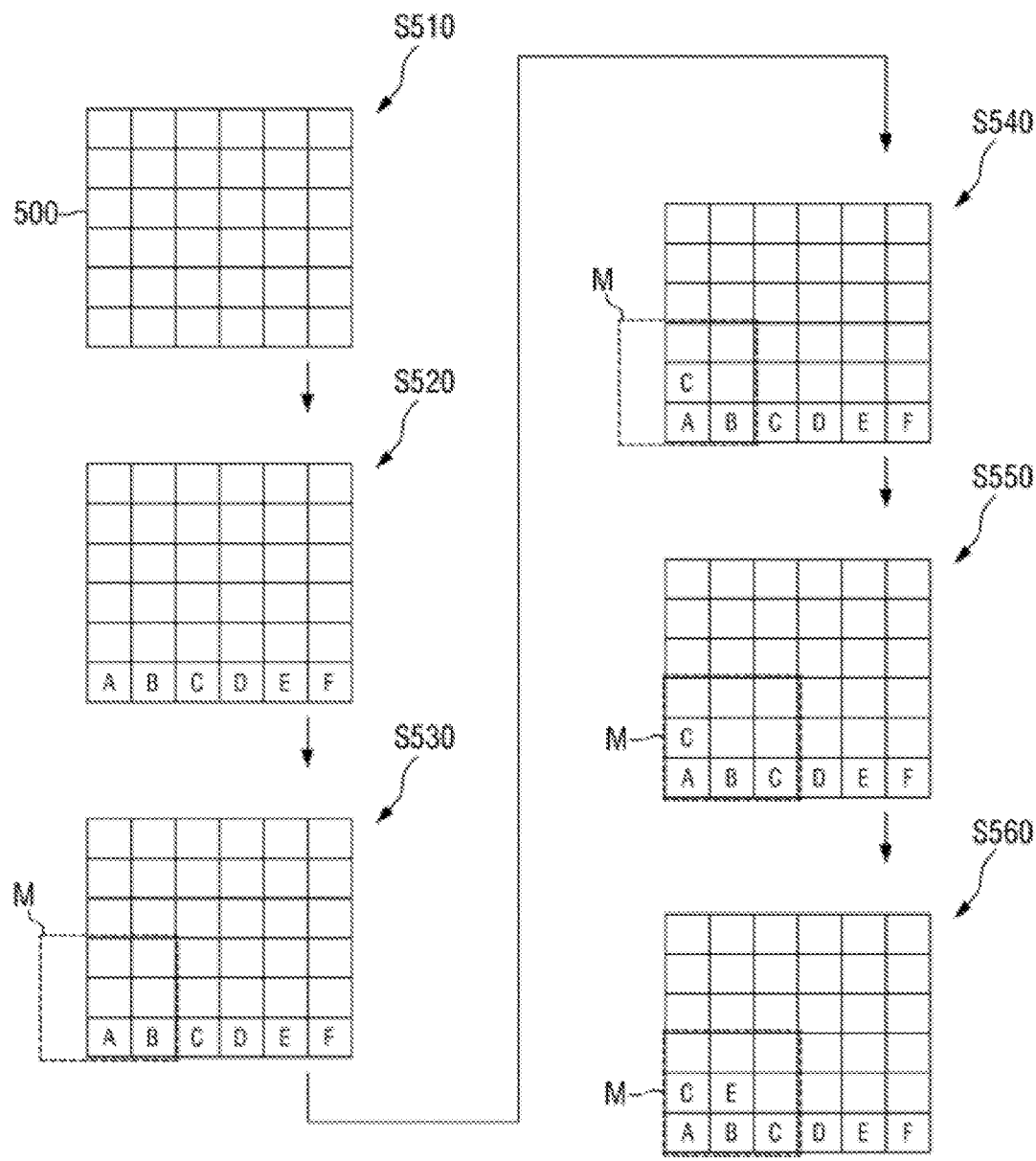
FIG. 5 is a diagram illustrating an arrangement of components in accordance with a random-based algorithm according to an exemplary embodiment.

FIG. 5 is a diagram illustrating an arrangement of components in accordance with a random-based algorithm according to an exemplary embodiment.

Referring to FIG. 5, the arrangement pattern calculation unit 240 may first divide the PCB 500 into a plurality of areas (S510). Here, each area of the plurality of areas means a point at which one component may be mounted. Hereinafter, it may be understood that the divided area and the divided point have the same or similar meanings. Further, the arrangement of a component by the arrangement pattern calculation unit 240 does not mean the mounting of an actual component on the PCB 500, but rather means the arrangement of a virtual component on a virtual area of the PCB 500 as calculation purposes.

In performing area division, the arrangement pattern calculation unit 240 may perform the area division in consideration of the number of components and the positions of the components to be mounted on the PCB 500.

FIG. 5 illustrates that the PCB 500 is divided into the areas in the form of a lattice at equal intervals, but the exemplary embodiment is not limited thereto. For example, the areas may be arranged in a line or at different intervals. Hereinafter, explanation will be made on the assumption that the components are arranged at equal intervals and the PCB 500 is divided into the areas in the form of a lattice as illustrated in FIG. 5.

If the area division is completed, the arrangement pattern calculation unit 240 may determine arrangement the components of the respective groups in a line at an end of one side of the divided areas (S520). FIG. 5 illustrates that the components of the respective groups are arranged in a line at the lowermost end of the divided areas. The arrangement pattern calculation unit 240 may successively arrange the components of the plurality of groups. FIG. 5 illustrates that the components of groups A through F are successively (i.e., in series) arranged on the divided areas.

Once the components of the respective groups are arranged in a line, the arrangement pattern calculation unit 240 may arrange the remaining components through applying of the random-based algorithm to the remaining empty areas.

In calculating the arrangement pattern for arranging the components at the specific points of the PCB 500 through the random-based algorithm, the arrangement pattern calculation unit 240 may set a masking area M having a predetermined size on the PCB 500 so that points/areas for arranging the components are included in the masking area M. FIG. 5 illustrates a masking area M having a size of 3×3 as an exemplary embodiment.

The arrangement pattern calculation unit 240 may set the masking area M on the PCB 500 so that a point for arranging the component (hereinafter referred to as a "component arrangement point") is positioned in the center of the masking area M (S530). At S530, it is illustrated that the left end of the second column from bottom (hereinafter referred to as "row 2") is the component arrangement point. Accordingly, the center of the masking area M is positioned at the left end of row 2.

On the other hand, at S530, the components of the groups A and B are included in the masking area M. That is, the components of the groups A and B are already included in the corresponding portion of the PCB 500. Accordingly, in selecting the components to be arranged at the component arrangement points, the arrangement pattern calculation portion 240 may select the remaining groups except for the groups of the components that are included in the masking area M. Because the components of the groups A and B are included in the masking area M, the arrangement pattern calculation unit 240 may select the groups C, D, E, and F.

Further, the arrangement pattern calculation unit 240 may calculate the arrangement pattern so that the components of the group randomly selected among the remaining groups are arranged at the component arrangement points. That is, the arrangement pattern calculation unit 240 selects one of the groups C, D, E, and F. S540 illustrates that the group C is selected among the groups C, D, E, and F, and the components of the group C are arranged at the component arrangement points.

The component arrangement that is performed by the arrangement pattern calculation unit 240 may be performed as moving the masking area M along the column. That is, if the component arrangement at the left end of the row 2 is completed, the component arrangement for the second area on the left side of the row 2 may be performed.

Accordingly, the arrangement pattern calculation unit 240 may set the masking area M on the PCB 500 so that the second area on the left of the row 2 is positioned in the center of the masking area M (S550).

On the other hand, at S550, the components of the groups A, B, and C are included in the masking area M. That is, the components of the groups A, B, and C are already included in the corresponding portion of the PCB 500. Accordingly, in selecting the components to be arranged at the component arrangement points, the arrangement pattern calculation portion 240 may select the remaining groups except for the groups of the components that are included in the masking area M. Because the components of the groups A, B, and C are included in the masking area M, the arrangement pattern calculation unit 240 may select the groups D, E, and F.

Further, the arrangement pattern calculation unit 240 may calculate the arrangement pattern so that the components of the group randomly selected among the remaining groups are arranged at the component arrangement points. That is, the arrangement pattern calculation unit 240 selects one of the groups D, E, and F. S560 illustrates that the group E is selected among the groups D, E, and F, and the components of the group E are arranged at the component arrangement points.

On the other hand, the remaining groups except for the groups of the components included in the masking area M may not exist depending on the number of provided groups and the size of the masking area M. For example, in the case where the number of groups is three (3) and the size of the masking area M is 3×3, the remaining groups except for the groups of the components included in the masking area M may not exist.

In this case, the arrangement pattern calculation unit 240 may calculate the arrangement pattern so that the components of the group randomly selected among the entire groups are arranged at the component arrangement points. That is, if there are the remaining groups except for the groups of the components included in the masking area M, the arrangement pattern calculation unit 240 selects one of the remaining groups and arranges the components of the selected group at the component arrangement points. If there are not the remaining groups except for the groups of the components included in the masking area M, the arrangement pattern calculation unit 240 selects one of the entire groups and arranges the components of the selected group at the component arrangement points.

This process may be performed with respect to the entire divided areas. That is, the arrangement pattern calculation unit 240 performs the component arrangement as moving the masking area M successively among the divided areas. For example, the arrangement pattern calculation unit 240 may perform the component arrangement as moving the masking area M from one end to the other end with respect to one column. Further, if the component arrangement in the corresponding column is completed, the arrangement pattern calculation unit 240 may perform the component arrangement as moving the masking area M in the next column.

On the other hand, according to exemplary embodiments, the arrangement pattern calculation unit 240 may position the masking area M in the divided area that is randomly selected to perform the component arrangement. That is, the arrangement pattern calculation unit 240 selects one of groups that are not included in the masking area M in the randomly selected position, and arranges the components of the corresponding group at the component arrangement points. In the case of randomly setting the position of the masking area M, the arrangement of the components of the respective groups in a line at the end of the divided areas, like S520, may be omitted.

Figure 6:
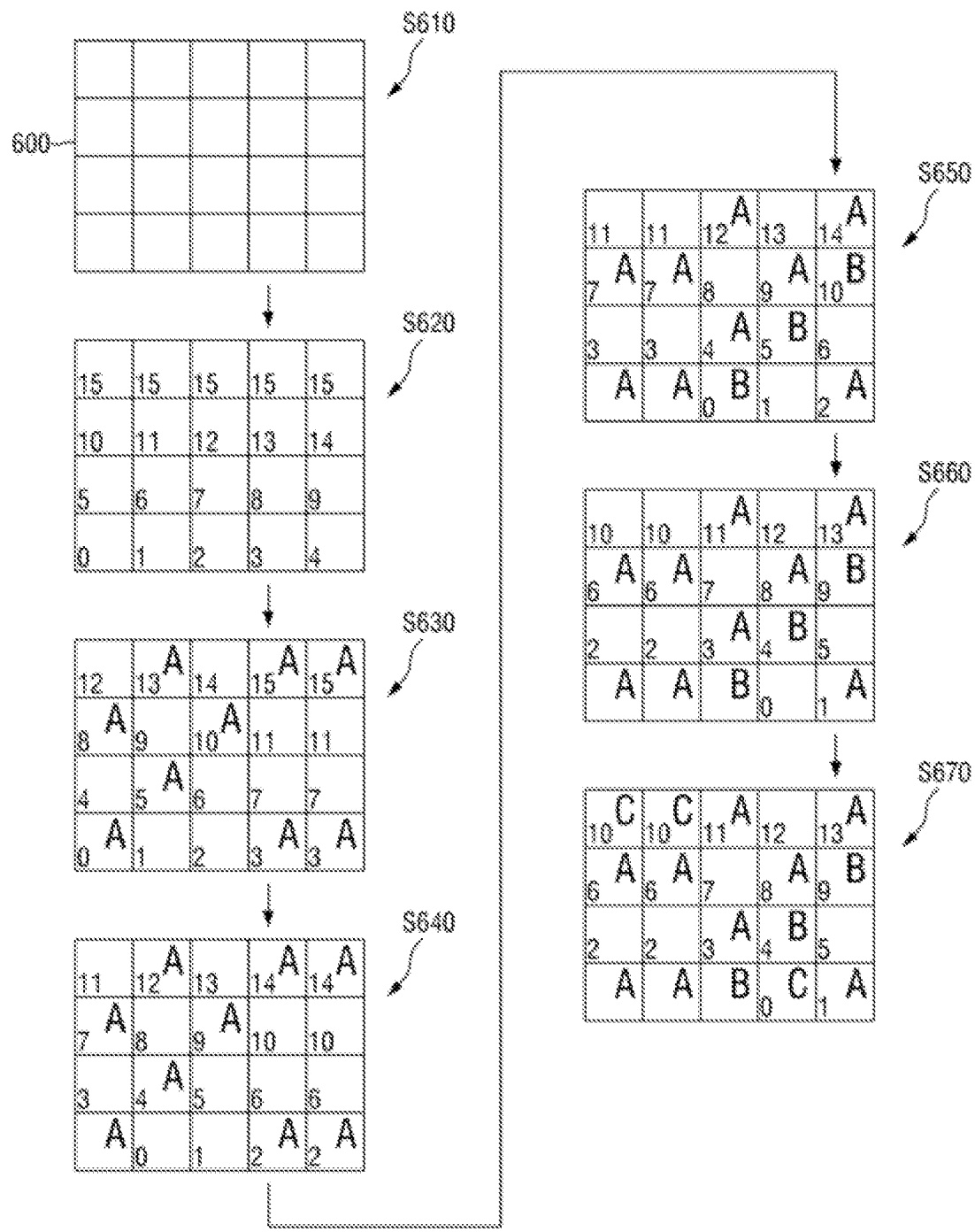
FIG. 6 is a diagram illustrating an arrangement of components in accordance with a rate-based algorithm according to an exemplary embodiment.

FIG. 6 is a diagram illustrating an arrangement of components in accordance with a rate-based algorithm according to an exemplary embodiment.

Referring to FIG. 6, the arrangement pattern calculation unit 240 may first divide the PCB 600 into a plurality of areas (S610). Here, each area means a point at which one component can be mounted.

In calculating the arrangement pattern for arranging components at specific points of the PCB through a rate-based algorithm, the arrangement pattern calculation unit 240 may calculate the arrangement pattern so that the components of the respective groups are arranged at intervals corresponding to the number of components included in the respective groups. For example, as the number of components included in the group becomes greater, the arrangement interval may become smaller, while as the number of components included in the group becomes smaller, the arrangement interval may become larger.

Here, the intervals corresponding to the number of components included in the respective groups may be determined by the rate of the number of entire components arranged on the PCB 600 to the number of components included in the respective groups. For example, in the case where the number of entire components arranged on the PCB 600 is one thousand (1000), and the number of components included in a specific group (e.g., Group A) is four hundred (400), the interval between the components of the corresponding group may be 2.5 (1000÷400=2.5). In the same manner, in the case where the number of components included in the specific group (e.g., Group B) is 200, the interval between the components of the corresponding group may be 5 (1000÷200=5).

On the other hand, the divided area of the PCB 600 on which the components are arranged is not an area that can be shared by another component, but is an area in which only one component is arranged. Accordingly, in the case where the interval between the components includes a decimal point, the arrangement area of the components may be determined by rounding to the nearest whole number. The arrangement points according to the arrangement intervals of the respective groups may be provided in the form of a table as illustrated in FIG. 7.

Referring to FIG. 7, a group interval table 700 may include respective group fields 710, 720, and 730.

Each of the group fields 710, 720, and 730 may include interval indexes and arrangement indexes of a corresponding field. The interval indexes may be a successive enumeration of the arrangement intervals of the corresponding field. For example, because the arrangement interval of group A is 2.5, the interval indexes of, for example, 0, 2.5, 5, and 7.5, may be provided.

The arrangement indexes represent indexes of the divided areas in which the components are actually arranged. The arrangement indexes may be determined by the interval indexes. On the other hand, because the arrangement indexes represent the actual divided areas, the indexes cannot include a decimal point. Accordingly, in the case where the decimal point is included in the interval index, the arrangement index may be determined by rounding up to the nearest whole number. For example, if the interval index is 2.5, the arrangement index may be 3. In the same manner, if the interval index is 7.5, the arrangement index may be 8.

FIG. 7 illustrates the group interval table 700 in which the respective arrangement intervals of groups A, B, and C are 2.5, 5, and 10, and thus interval indexes and arrangement indexes according to the arrangement intervals are included. The group interval table 700 by groups may be stored in the storage unit 220, and the arrangement pattern calculation unit 240 may calculate the arrangement pattern with reference to the group interval table 700.

Referring back to FIG. 6, the arrangement pattern calculation unit 240 may successively arrange the components of the respective groups on the PCB 600. FIG. 6 illustrates that the components are arranged in the order of group A, group B, and group C.

If the area division is completed, the arrangement calculation unit 240 may set indexes for group A to the respective divided areas (S620). The indexes may be set with respect to the divided areas, starting from "0" and increasing by "1". Because there is no area in which the component is arranged, the indexes may start from the left end of the lowermost row (hereinafter referred to as "row 1").

If the index setting is completed, the arrangement pattern calculation unit 240 may arrange the components of the group A on the PCB with reference to the arrangement indexes specified in the group interval table 700 (S630). That is, the arrangement pattern calculation unit 240 arranges the components of the group A in the divided areas having the indexes that correspond to the arrangement indexes included in the group A field 710 of the group interval table 700. Accordingly, the components of the group A are arranged at intervals of 2 or 3.

If the arrangement of the components of the group A is completed, the arrangement pattern calculation unit 240 may perform the component arrangement of the group B. In order to perform the component arrangement of the group B, the arrangement pattern calculation unit 240 may set the indexes to the divided areas (S640). In the exemplary embodiment, the arrangement pattern calculation unit 240 may set the indexes, starting from the foremost divided area among the divided areas in which the components have not yet been arranged. Because the arrangement of the components of the group A has already been performed, the component of the group A is arranged at the left end of row 1. Accordingly, the arrangement pattern calculation unit 240 may set the indexes, starting from the second divided area on the left side of the column 1.

If the index setting is completed, the arrangement pattern calculation unit 240 may arrange the components of the group B on the PCB 600 with reference to the arrangement indexes specified in the group interval table 700 (S650). That is, the arrangement pattern calculation unit 240 arranges the components of the group B in the divided areas having the indexes corresponding to the arrangement indexes included in the group B field 720 of the group interval table 700. Accordingly, the components of the group B are arranged at intervals of 5.

If the arrangement of the components of the group B is completed, the arrangement pattern calculation unit 240 may perform the component arrangement of the group C. In order to perform the component arrangement of the group C, the arrangement pattern calculation unit 240 may set the indexes to the divided areas (S660). In the exemplary embodiment, the arrangement pattern calculation unit 240 may set the indexes, starting from the foremost divided area among the divided areas in which the components have not yet been arranged. Because the arrangement of the components of the groups A and B has already been performed, the foremost divided area becomes the third divided area on the left side of the row 1. Accordingly, the arrangement pattern calculation unit 240 may set the indexes, starting from the third divided area on the left side of the column 1.

If the index setting is completed, the arrangement pattern calculation unit 240 may arrange the components of the group C on the PCB with reference to the arrangement indexes specified in the group interval table 700 (S670). That is, the arrangement pattern calculation unit 240 arranges the components of the group C in the divided areas having the indexes corresponding to the arrangement indexes included in the group C field 730 of the group interval table 700. Accordingly, the components of the group C are arranged at intervals of 10.

The component arrangement by the arrangement pattern calculation unit 240 may be performed until the component arrangement of all the groups is completed.

Although FIG. 6 illustrates that the component arrangement is performed, starting from the group A having the shortest arrangement interval, the component arrangement according to the present invention is not limited thereto. For example, the component arrangement may be performed in the order of the randomly selected groups.

Figure 8:
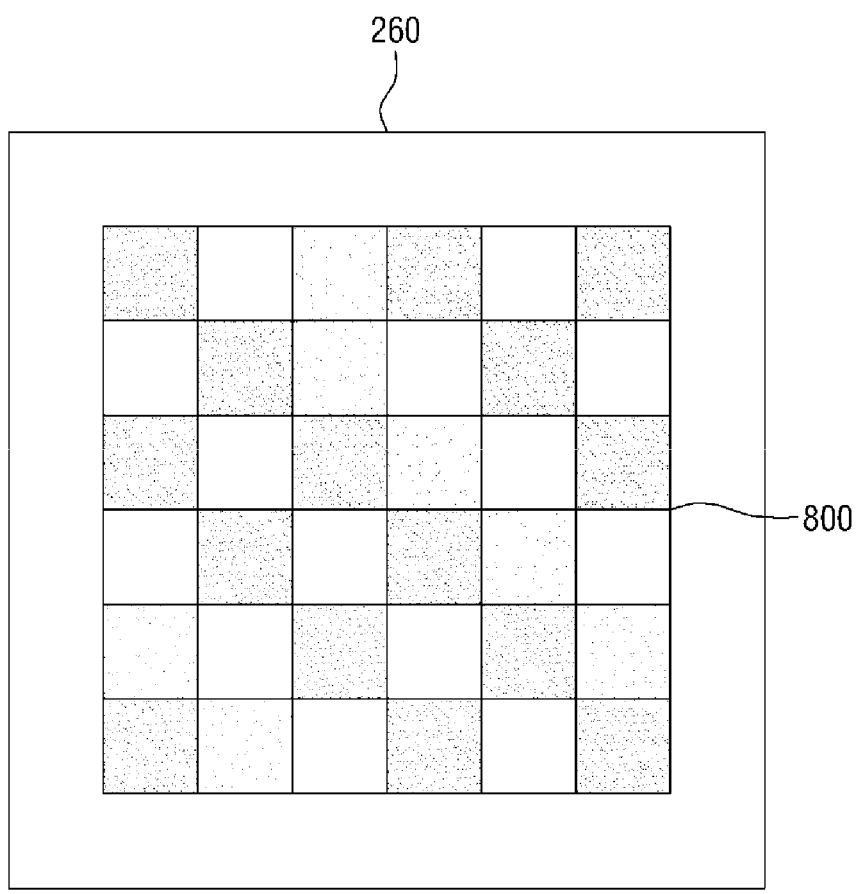
FIG. 8 is a diagram explaining output of an arrangement pattern according to an exemplary embodiment.

FIG. 8 is a diagram explaining output of an arrangement pattern according to an exemplary embodiment.

If the calculation of the arrangement pattern by the arrangement pattern calculation unit 240 is completed, the interface generation unit 250 may generate an interface 800 in which the arrangement pattern is reflected, and the output unit 260 may output the interface 800.

FIG. 8 illustrates that the interface 800 in which the reflected/determined arrangement pattern is output. The interface 800 may include a PCB that is divided into a plurality of divided areas. On the respective divided areas, the components of the corresponding groups may be displayed. For example, characters or figures that indicate the groups may be displayed on the respective divided areas. Further, different colors may be given to the respective groups to be displayed on the divided areas.

A user may confirm the arrangement pattern of the components of the groups through the interface 800 in which the arrangement pattern is reflected. Further, the user may replace the component of a specific divided area by another component.

Figure 9:
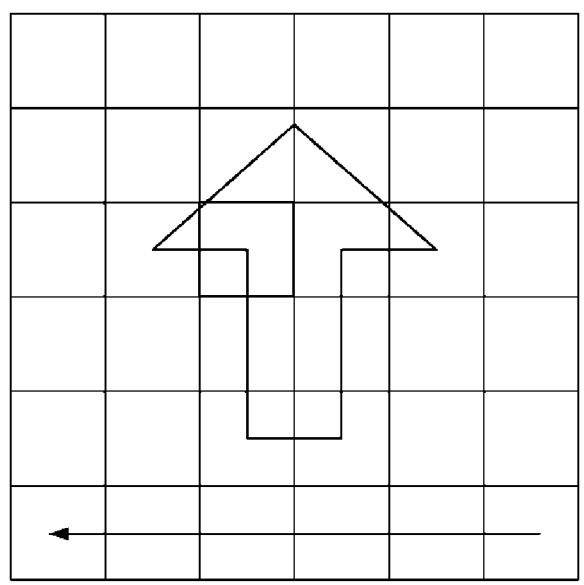
FIG. 9 is a diagram explaining a direction of a component arrangement according to an exemplary embodiment.

FIG. 9 is a diagram explaining the direction of a component arrangement according to an exemplary embodiment.

As described above, the component arrangement is performed as going from the left end to the right end of the row 1. However, the direction of the component arrangement is not limited thereto, but may be determined in various manners. For example, as illustrated in FIG. 9, the component arrangement may also be performed as going from the right end to the left end of the row 1.

That is, the components may be arranged as going from the right end to the left end of the column 1, and then the components may be arranged as going from the right end to the left end of row 2.

In the same manner, the component arrangement may be performed, starting from the left end of the uppermost column or the right end of the uppermost column, or the component arrangement may be performed in a vertical direction.

Figure 10:
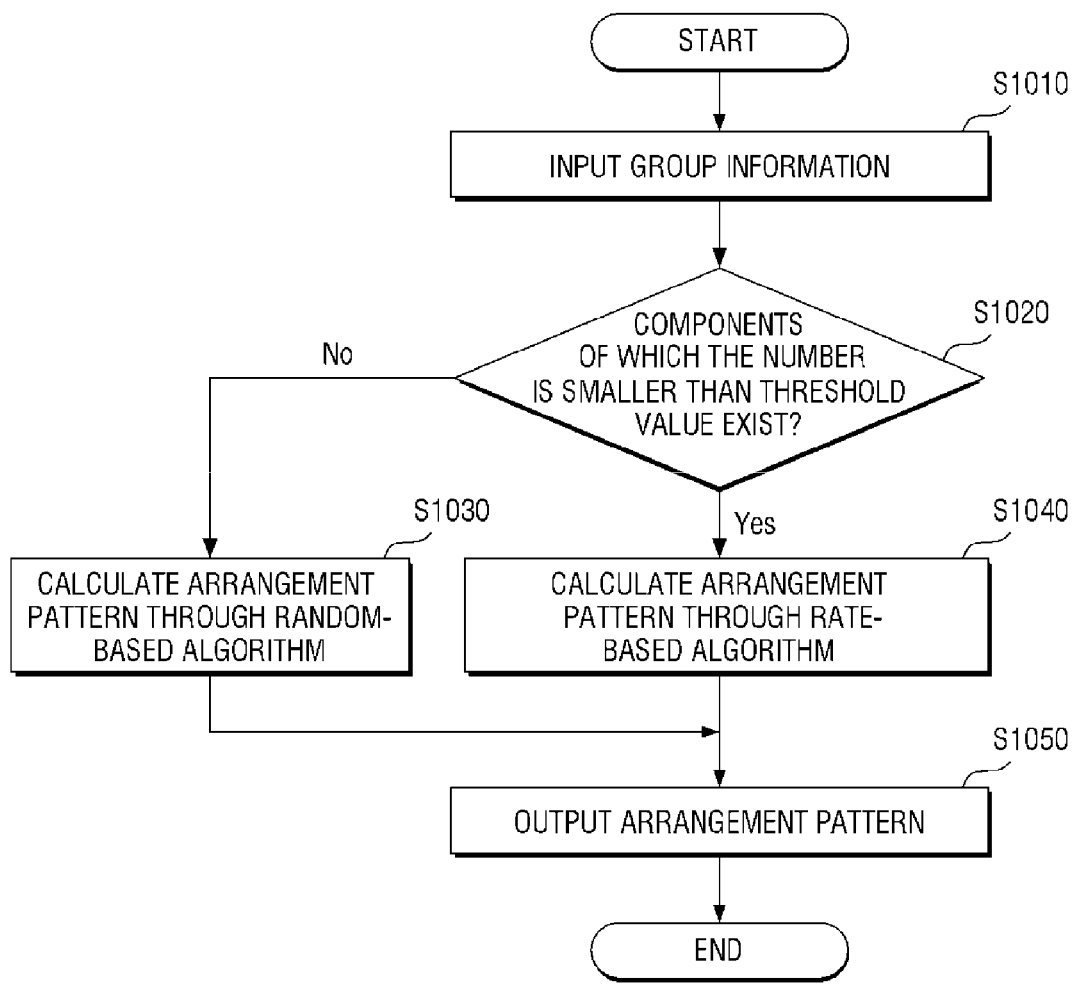
FIG. 10 is a flowchart illustrating a method for calculating an arrangement pattern according to an exemplary embodiment.

FIG. 10 is a flowchart illustrating a method for calculating an arrangement pattern according to an exemplary embodiment.

First, the input unit 210 receives an input of group information from a user (S1010). The group information may include at least one of the lot number, the identification number, the performance, and the number of components included in the corresponding group.

The arrangement pattern calculation unit 240 confirms whether the number of components included in the respective groups is smaller than a threshold value (S1020). If there exists no group having components of which the number is smaller than the threshold value, the arrangement pattern calculation unit 240 calculates the arrangement pattern through a random-based algorithm (S1030).

On the other hand, if there exist groups having components of which the number is smaller than the threshold value, the arrangement pattern calculation unit 240 calculates the arrangement pattern through a rate-based algorithm (S1040).

If the calculation of the arrangement pattern is completed, the output unit 260 outputs the calculated arrangement pattern (S1050).

Further, the arrangement pattern that is calculated by the arrangement pattern calculation unit 240 may be reflected in a work file, and the corresponding work file may be transferred to SMT equipment 100 to be used for component mounting.

The operations or steps of the methods or algorithms described above can be embodied as computer readable codes on a computer readable recording medium, or to be transmitted through a transmission medium. The computer readable recording medium is any data storage device that can store data which can be thereafter read by a computer system. Examples of the computer readable recording medium include read-only memory (ROM), random-access memory (RAM), compact disc (CD)-ROM, digital versatile disc (DVD), magnetic tape, floppy disk, and optical data storage device, not being limited thereto. The transmission medium can include carrier waves transmitted through the Internet or various types of communication channel. The computer readable recording medium can also be distributed over network coupled computer systems so that the computer readable code is stored and executed in a distributed fashion.

At least one of the components, elements, modules or units represented by a block as illustrated in FIG. 3 may be embodied as various numbers of hardware, software and/or firmware structures that execute respective functions described above, according to an exemplary embodiment. For example, at least one of these components, elements, modules or units may use a direct circuit structure, such as a memory, a processor, a logic circuit, a look-up table, etc. that may execute the respective functions through controls of one or more microprocessors or other control apparatuses. Also, at least one of these components, elements, modules or units may be specifically embodied by a module, a program, or a part of code, which contains one or more executable instructions for performing specified logic functions, and executed by one or more microprocessors or other control apparatuses. Also, at least one of these components, elements, modules or units may further include or may be implemented by a processor such as a central processing unit (CPU) that performs the respective functions, a microprocessor, or the like. Two or more of these components, elements, modules or units may be combined into one single component, element, module or unit which performs all operations or functions of the combined two or more components, elements, modules or units. Also, at least part of functions of at least one of these components, elements, modules or units may be performed by another of these components, elements, modules or units. Further, although a bus is not illustrated in the above block diagrams, communication between the components, elements, modules or units may be performed through the bus. Functional aspects of the above exemplary embodiments may be implemented in algorithms that execute on one or more processors. Furthermore, the components, elements, modules or units represented by a block or processing steps may employ any number of related art techniques for electronics configuration, signal processing and/or control, data processing and the like.

Although exemplary embodiments have been particularly shown and described above, those skilled in the art will understand that various modifications, additions and substitutions made be made therein without departing from the scope and spirit of the inventive concept as disclosed in the following claims.

What is claimed is:

1. An apparatus for providing an arrangement pattern, the apparatus comprising:
   at least one processor configured to:
      receive an input of group information about groups, the groups comprising a plurality of surface mounting devices (SMDs) having a same function and being classified based on a predetermined standard;
      determine an arrangement pattern for arranging the plurality of SMDs on a printed circuit board (PCB) so that first SMDs of a first group of the groups are dispersedly arranged amongst the plurality of SMDs based on the group information of the groups; and
      generate a work file including the determined arrangement pattern, the work file being read by surface mounting technology (SMT) equipment to mount the SMDs on the PCB according to the determined arrangement pattern.

2. The apparatus of claim 1, wherein the group information comprises at least one of a lot number, an identification number, performance, and a number of SMDs included in a corresponding group in the groups.

3. The apparatus of claim 1, wherein each group comprises a reel comprising at least one component.

4. The apparatus of claim 1, wherein the at least one processor is configured to determine the arrangement pattern through a random-based algorithm in response to a number of the first SMDs included in the first group being greater than or equal to a threshold value.

5. The apparatus of claim 4, wherein the at least one processor is configured to set a masking area having a predetermined size on the PCB so that a plurality of divided areas are included in the masking area, configured to determine remaining groups out of the groups, the remaining groups excluding a group having SMDs included in the masking area, and configured to determine the arrangement pattern so that SMDs of the remaining groups are arranged at the plurality of divided areas.

6. The apparatus of claim 5, wherein in response to there not being the remaining groups included in the masking area, the at least one processor is configured to determine the arrangement pattern so that SMDs of a randomly selected group among the groups are arranged at the plurality of divided areas in the masking area.

7. The apparatus of claim 1, wherein the at least one processor is configured to determine the arrangement pattern through a rate-based algorithm in response to a number of the first SMDs included in the first group being smaller than a threshold value.

8. The apparatus of claim 7, wherein the at least one processor is configured to determine the arrangement pattern so that the first SMDs of the first group are arranged at an interval corresponding to a number of SMDs included in the first group.

9. The apparatus of claim 8, wherein the interval corresponding to the number of the first SMDs included in the first group is determined by a ratio of a total number of SMDs arranged on the PCB to the number of the first SMDs included in the first group.

10. The apparatus of claim 1, wherein the at least one processor is configured to output the arrangement pattern in which the plurality of SMDs are displayed with different colors based on the groups.

11. The apparatus of claim 1, wherein the at least one processor is configured to determine the arrangement pattern so that SMDs of respective groups are repeatedly arranged in a predetermined order of groups.

12. The apparatus of claim 1, wherein the at least one processor is configured to determine the arrangement pattern so that SMDs included two or more predetermined groups of the groups are dispersedly arranged.

13. A method for providing an arrangement pattern, comprising:
   receiving an input of group information about groups, the groups comprising a plurality of surface mounting devices (SMDs) having a same functions and being classified based on a predetermined standard;
   determining an arrangement pattern for arranging the plurality of SMDs on a printed circuit board (PCB) so that SMDs of a first group of the groups are dispersedly arranged amongst the plurality of SMDs based on the group information of the groups; and
   generating a work file including the determined arrangement pattern, the work file being read by surface mounting technology (SMT) equipment to mount the SMDs on the PCB according to the determined arrangement pattern.

14. The method of claim 13, wherein the group information comprises at least one of a lot number, an identification number, performance, and a number of SMDs included in a corresponding group in the groups.

15. The method of claim 13, wherein the determining the arrangement pattern comprises determining the arrangement pattern through a random-based algorithm in response to a number of the first SMDs included in the first group being greater than or equal to a threshold value.

16. The method of claim 15, wherein the determining the arrangement pattern comprises:
 setting a masking area having a predetermined size on the PCB so that a plurality of divided areas are included in the masking area, the plurality of SMDs being arranged at the plurality of divided areas;
 selecting remaining groups out of the groups, the remaining groups excluding a group having SMDs included in the masking area; and
 determining the arrangement pattern so that SMDs of the remaining groups are arranged at the plurality of areas.

17. The method of claim 13, wherein the determining the arrangement pattern comprises determining the arrangement pattern through a rate-based algorithm in response to a number of the first SMDs included in the first group is smaller than a threshold value.

18. The method of claim 17, wherein the determining the arrangement pattern comprises determining the arrangement pattern so that the first SMDs of the first group are arranged at an interval corresponding to the number of the first SMDs included in the first group.

19. The method of claim 18, wherein the interval corresponding to the number of the first SMDs included in the first group are determined by a ratio of a total number of the plurality of SMDs arranged on the PCB to the number of the first SMDs included in the first group.

20. The method of claim 13, wherein the outputting the arrangement pattern comprises outputting the arrangement pattern in which the plurality of SMDs are displayed with different colors based on the groups.

* * * * *